(12) United States Patent
White

(10) Patent No.: US 7,863,896 B2
(45) Date of Patent: Jan. 4, 2011

(54) SYSTEMS AND METHODS FOR CALIBRATING FUNCTIONAL MAGNETIC RESONANCE IMAGING OF LIVING TISSUE

(75) Inventor: Keith David White, Gainesville, FL (US)

(73) Assignee: University of Florida Research Foundation, Inc., Gainesville, FL (US)

(*) Notice: Subject to any disclaimer, the term of this patent is extended or adjusted under 35 U.S.C. 154(b) by 287 days.

(21) Appl. No.: 12/170,181

(22) Filed: Jul. 9, 2008

(65) Prior Publication Data

US 2008/0281184 A1 Nov. 13, 2008

Related U.S. Application Data

(63) Continuation of application No. PCT/US2007/066869, filed on Apr. 18, 2007.

(60) Provisional application No. 60/793,210, filed on Apr. 19, 2006.

(51) Int. Cl.
*G01V 3/00* (2006.01)
(52) U.S. Cl. ........................ 324/309; 324/317
(58) Field of Classification Search ............ 324/309, 324/307, 317
See application file for complete search history.

(56) References Cited

U.S. PATENT DOCUMENTS

| | | | |
|---|---|---|---|
| 6,370,416 B1 | 4/2002 | Rosenfeld | |
| 6,539,246 B2 | 3/2003 | Heid | |
| 6,618,607 B2 | 9/2003 | Song | |
| 6,704,593 B2 | 3/2004 | Stainsby et al. | |
| 6,708,051 B1 | 3/2004 | Durousseau | |
| 6,845,261 B2 | 1/2005 | Pettersson et al. | |
| 6,915,152 B2 | 7/2005 | Zhu | |
| 7,215,122 B2* | 5/2007 | Zhao et al. | 324/318 |
| 2002/0045814 A1 | 4/2002 | Heid | |
| 2002/0193684 A1 | 12/2002 | Anderson et al. | |
| 2003/0078491 A1 | 4/2003 | Mueller et al. | |
| 2005/0110490 A1 | 5/2005 | Zhao et al. | |
| 2007/0088211 A1* | 4/2007 | Cheng et al. | 600/410 |
| 2007/0287904 A1* | 12/2007 | Li et al. | 600/410 |

FOREIGN PATENT DOCUMENTS

| | | |
|---|---|---|
| JP | 2004-248823 A | 9/2004 |
| WO | WO 2004/104617 A2 | 12/2004 |
| WO | WO 2005/031282 A2 | 4/2005 |
| WO | WO 2005/033725 A1 | 4/2005 |

OTHER PUBLICATIONS

Backfrieder et al., "Quantification of Intensity Variations in Functional MR Images Using Rotated Principal Components," *Physics in Medicine and Biology*, vol. 41, 1996, pp. 1425-1438.

(Continued)

*Primary Examiner*—Louis M Arana
(74) *Attorney, Agent, or Firm*—Alston & Bird LLP

(57) ABSTRACT

Embodiments of the present invention relate to systems and methods for calibrating functional magnetic resonance imaging of living tissue. For example, a calibration method includes providing a contrast signal simulation device configured for generating one or more pre-determined contrast simulation signals selected from a group consisting of BOLD and BOSS contrast simulation signals that simulate at least one contrast signal generated by living tissue of a subject and positioning the contrast signal simulation device adjacent to the subject. The method includes using an imaging instrument to take first and second data sets from the subject's tissue while the contrast signal simulation device is disposed adjacent to the subject and while generating and not generating the one or more pre-determined contrast simulation signals, respectively. The method also includes using the first and second data sets to determine at least one figure of merit of the imaging instrument, the contrast simulation device, and/or the living tissue.

20 Claims, 2 Drawing Sheets

OTHER PUBLICATIONS

Buxton et al., "Modeling the Hemodynamic Response to Brain Activation," *NeuroImage*, vol. 23, 2004, pp. S220-S233.

Cheng et al., "SmartPhantom—an fMRI Simulator," *Magnetic Resonance Imaging*, vol. 24, 2006, pp. 301-313.

The International Search Report and Written Opinion for International Appl. No. PCT/US2007/066869, mailed Oct. 16, 2007.

Fujita et al., "Quantitative Mapping of Cerebral Deoxyhemoglobin Content Using MR Imaging," *NeuroImage*, vol. 20, 2003, pp. 2071-2083.

Hyder et al., "Quantitative fMRI of Rat Brain by Multi-Modal MRI and MRS Measurements," *International Congress Series*, vol. 1235, 2002, pp. 57-71.

Hyder et al., "Quantitative Functional Imaging of the Brain: Towards Mapping Neuronal Activity by BOLD fMRI," *NMR in Biomedicine*, vol. 14, 2001, pp. 413-431.

Koopmans et al., "Development of a Reference Phantom for fMRI Studies," *Proceedings of the International Society for Magnetic Resonance in Medicine 11$^{th}$ Scientific Meeting and Exhibition*, Jul. 10-16, 2003, Toronto, p. 1039.

Kruger et al., "Physiological Noise in Oxygenation-Sensitive Magnetic Resonance Imaging," *Magnetic Resonance in Medicine*, vol. 46, 2001, pp. 631-637.

Lee et al., "fMRI Quality Assurance Using Phase Space Reconstruction of SmartPhantom Simulations of BOLD Contrast," *Proceedings of the International Society for Magnetic Resonance in Medicine 14Scientific Meeting and Exhibition*, May 6-12, 2006, Seattle, p. 3266.

Li et al., "Characterization and Suppression of System Noise Due to Scanner Instability in fMRI Using a Smart Phantom Bold Simulator," *Proceedings of the International Society for Magnetic Resonance in Medicine 14$^{th}$ Scientific Meeting and Exhibition*, May 6-12, 2006, Seattle, p. 2802.

Morgan et al., "Comparison of Functional MRI Image Realignment Tools Using a Computer-Generated Phantom," *Magnetic Resonance in Medicine*, vol. 46, 2001, pp. 510-514.

Nilsson et al., "Evaluation of a Two Compartment Gel Phantom for fMRI," *Proceedings of the International Society for Magnetic Resonance in Medicine*, vol. 14, 2006, p. 2805.

Ogawa et al., "Functional Brain Mapping by Blood Oxygenation Level-Dependent Contrast Magnetic Resonance Imaging," *Biophysics Journal*, vol. 64, Mar. 1993, pp. 803-812.

Pickens et al., "Development of Computer-Generated Phantoms for FMRI Software Evaluation," *Magnetic Resonance Imaging*, vol. 23, pp. 653-663.

Price et al., "Practical Aspects of Functional MRTI (NMR Task Group #8)", *Medical Physics*, vol. 29, No. 8, Aug. 2002, pp. 1892-1912.

Renvall et al., "Functional Phantom for fMRI: a Feasibility Study," *Magnetic Resonance Imaging*, vol. 24, 2006, pp. 315-320.

Seiyama et al., "Circulatory Basis of fMRI Signals: Relationship Between Changes in the Hemodynamic Parameters and BOLD Signal Intensity," *NeuroImage*, vol. 21, 2004, pp. 1204-1214.

Triantafyllou et al., "Comparison of Physiological Noise at 1.5 T, 3 T and 7 T and Optimization of fMRI Acquisition Parameters," *NeuroImage*, vol. 26, 2005, pp. 243-250.

Windischberger et al., "Fuzzy Cluster Analysis of High-Field Functional MRI Data," *Artificial Intelligence in Medicine*, vol. 29, 2003, pp. 203-223.

Wise et al., "Resting Fluctuations in Arterial Carbon Dioxide Induce Significant Low Frequency Variations in BOLD Signal," *NeuroImage*, vol. 21, 2004, pp. 1652-1664.

Yacoub et al., "Signal and Noise Characteristics of Hahn SE and GE BOLD fMRI at 7 T in Humans," *NeuroImage*, vol. 24, 2005, pp. 738-750.

Zarahn et al., "Some Limit Results for Efficiency in Stochastic fMRI Designs," *Biometrical Journal*, vol. 44, 2002, p. 496-509.

Zhao et al., "Calibration of fMRI by Simulating BOLD Contrast in the Living Human Brain," *Proceedings of the International Society for Magnetic Resonance in Medicine*, vol. 14, 2006, p. 2832.

Zhao et al., "Development of Smart Phantom for Characterizing fMRI Informatics Tools," *Proceedings of the International Society for Magnetic Resonance in Medicine 11$^{th}$ Scientific Meeting and Exhibition*, Jul. 10-16, 2003, Toronto, p. 1834.

Zhao et al., "Test-Retest Reliability of fMRI Using SmartPhantom," *Proceedings of the International Society for Magnetic Resonance in Medicine 14$^{th}$ Scientific Meeting and Exhibition*, May 6-12, 2006, Seattle, p. 2835.

Kim et al., "Determination of Relative $CMRO_2$ From CBF and BOLD Changes: Significant Increase of Oxygen Consumption Rate During Visual Stimulation," *Magnetic Resonance in Medicine*, vol. 41, 1999, pp. 1152-1161.

Klaiman et al., "Blind Separation of Sources in Functional MRI Sequences," Jul. 2002, <http://visl.technion.ac.il/projects/PSPL/2002s01/fmri_book.pdf>.

Stenger et al., "3D Spiral Cardiac/Respiratory Ordered fMRI Data Acquisition at 3 Tesla," *Magnetic Resonance in Medicine*, vol. 41, 1999, pp. 983-991.

Yoo et al., "Multiresolution Data Acquisition and Detection in Functional MRI," *NeuroImage*, vol. 14, pp. 1476-1485. (2001).

\* cited by examiner

SYSTEMS AND METHODS FOR CALIBRATING FUNCTIONAL MAGNETIC RESONANCE IMAGING OF LIVING TISSUE

CROSS-REFERENCE TO RELATED APPLICATIONS

The present application is a Continuation of International Application No. PCT/US2007/066869, filed Apr. 18, 2007, which claims the benefit of U.S. Provisional Application No. 60/793,210, filed Apr. 19, 2006. The disclosures of both referenced applications are incorporated herein by reference.

BACKGROUND OF THE INVENTION

Functional Magnetic Resonance Imaging, or fMRI, includes imaging techniques that may be used to determine which areas of a patient's brain (or other tissues) are activated by different types of activities, such as the patient moving their fingers or reacting to a particular image. To execute an fMRI scan of the brain, for example, an MRI machine is first configured to image increased blood flow to activated brain areas. A task event is then provided that is likely to cause activity, and changes in blood flow, in the patient's brain. (Such events may include, for example, viewing pictures that may be selectively presented to the patient during the course of the imaging, naming exemplars within a category of items, solving a math problem, making a specific movement, etc.). A high-resolution anatomical scan is taken of the patient's brain for later use in creating a background for a composite image showing the activated areas of the patient's brain. A series of low spatial but high temporal resolution functional scans are then taken of the patient's brain over time (e.g., 6 whole-brain scans taken every 10 seconds). During this process, the event is present for some of the scans, and absent in others. For technical reasons, these images are acquired in "k-space" format, which must be subjected to Fourier transforms to be visualized.

After transforming these images and correcting for distortions, statistical analysis (such as t-tests or deconvolution multiple regression) compares the "with event" scans to the "without event" scans to determine which parts of the brain were activated reliably by the event. The reliably activated areas (as measured in the low spatial resolution functional scans) are superimposed in color on top of the high-resolution anatomical scan of the patient's brain. This composite image may be viewed in 3D, and typically may be viewed from any angle. This presents a visual indication of exactly which areas of the brain were activated by the specified event (e.g., stimulus perception, word finding, problem solving, or action).

The basis for the fMRI process generates blood-oxygenation-level-dependent (BOLD) and blood-oxygenation-steady-state (BOSS) contrasts. Oxyhemoglobin, like water and brain tissue, is diamagnetic (negative magnetic susceptibility) while deoxyhemoglobin is paramagnetic (small positive susceptibility). The ratio of deoxy- to oxyhemoglobin in a blood vessel affects the local magnetic field, which in turn affects the precession frequencies of local water protons exposed to the strong main magnetic field used for MRI. BOSS contrast involves measuring this frequency spectrum (analogous to FM radio). Changes in precession frequencies alter the ability to rephase the protons' radio frequency (RF) signals, which are spatially encoded by magnetic gradients. BOLD contrast involves measuring signal amplitudes, which are affected by de- and re-phasing (analogous to AM radio). At a place in the brain where increased neural activity's metabolic demands convert oxy- to deoxyhemoglobin, there is a reduction in RF signal strength through reduced rephasing as the RF spectrum shifts. Within a few seconds an influx of blood oversupplies this locale with new oxyhemoglobin, yielding a relatively large signal increase and spectral shift. After the neural activity ends, the RF signal gradually decays toward the pre-activity level. This time-varying signal, known as a hemodynamic response, is the fMRI signature from which underlying neural activity is inferred.

Calibration within the field of fMRI is challenging because repeatability is imperfect—even when using the same procedures with the same subject. Calibrations of fMRI instruments have previously been done using phantoms filled with aqueous solutions or gels. Ordinary engineering calibrations of the signal-to-noise ratio in such phantoms capture the reliability of spatially encoding the fMRI data into "k-space" (that is, encoding spatial frequency or "where" activity happened) without addressing contrast-to-noise reliability for fMRI applications (that is, "what" activity happened).

It is difficult to establish a calibration standard for in vivo fMRI data. In this regard, repeatable data are necessary for calibration, but living participants introduce multiple sources of variance into the measurements. In particular, the presence of instrument noise and "physiological noise" produced by a living human brain (or by extension, produced by other living tissue) affects the repeatability of acquiring BOLD/BOSS contrast signals. In addition, there may be many other sources of measurement variability, such as the anatomical differences of different human subjects, irreproducible involuntary head motion artifacts, and the ongoing metabolic activities of the brain. Thus, current techniques for calibrating the sensitivity and specificity of an fMRI test for detecting BOLD/BOSS contrast signals in the presence of such variable and idiosyncratic noise remain inadequate. Sensitivity and specificity are important figures of merit for test reliability that are widely adopted for evaluating medical tests, because many physicians rely upon sensitivity and specificity indices to interpret test results for individual patients. A further important figure of merit known as receiver operating characteristic (ROC) combines the information from sensitivity and specificity.

Therefore, there is a need for improved systems and methods for calibrating fMRI. Namely, there is a need for systems and methods that calibrate fMRI test results by taking into account various in vivo signals as well as instrument noise, to establish figures of merit for the test results including sensitivity, specificity, and ROC.

SUMMARY OF THE INVENTION

Embodiments of the present invention relate to systems and methods for calibrating functional magnetic resonance imaging of living tissue. For example, a calibration method includes providing a contrast signal simulation device configured for generating one or more pre-determined BOLD and/or BOSS contrast simulation signals that simulate at least one BOLD/BOSS contrast signal generated by living tissue of a subject (e.g., a human being or a living animal) and positioning the contrast signal simulation device adjacent to the subject. The method also includes using an imaging instrument (e.g., a magnetic resonance imaging device) to take a first data set from said subject's tissue while: (A) the contrast signal simulation device is disposed adjacent to the subject, and (B) the contrast signal simulation device is generating the one or more pre-determined BOLD/BOSS contrast simulation signals. The method further includes using the imaging instrument to take a second data set from the subject's tissue while the contrast signal simulation device is not generating the one or more pre-determined BOLD/BOSS contrast simulation signals and using the first and second data sets to determine at least one figure of merit of the imaging instrument, the contrast simulation device, and/or the living tissue (e.g., a sensitivity, a specificity, and/or a receiver operating characteristic).

According to aspects of the method, the figure of merit of the imaging instrument takes into account in vivo noise associated with the subject. In addition, the step of using the first and second data sets to determine at least one figure of merit may include determining statistically reliable differences between the first and second data sets. The method may further include using the imaging instrument to acquire a third data set of the subject's tissue while the subject is being subjected to a particular task or event and using the imaging instrument to take a fourth data set of the subject's tissue while the subject is not being subjected to the particular task or event. In addition, the method may include using the third and fourth data sets to determine statistically significant differences between the third and fourth data sets and using the at least one figure of merit to assess an accuracy of the statistically significant differences between the third and fourth data sets. Moreover, each of the first and second data sets may be comprised spatially of at least one or more voxels. The first and second data sets may include instrument noise, physiological noise, and/or data regarding said one or more pre-determined BOLD/BOSS contrast simulation signals. Furthermore, using the first and second data sets to determine the at least one figure of merit of the living tissue may include determining at least one figure of merit of the living tissue and associated physiological noise and/or determining effects resulting from manipulation of the calibration method that affect the physiological noise.

An additional aspect of the present invention provides a calibration system that includes a contrast signal simulation device that is configured for generating one or more pre-determined BOLD and/or BOSS contrast simulation signals. The one or more pre-determined BOLD/BOSS contrast simulation signals simulate at least one BOLD/BOSS contrast signal generated by living tissue of a subject. The system also includes an imaging instrument configured to take a first data set from said subject's tissue while: (A) the contrast signal simulation device is disposed adjacent to the subject, and (B) the contrast signal simulation device is generating the one or more pre-determined BOLD/BOSS contrast simulation signals. The imaging instrument is further configured to take a second data set from the subject's tissue while the BOLD/BOSS contrast signal simulation device is not generating the one or more pre-determined BOLD/BOSS contrast simulation signals. The system additionally includes at least one processing element configured to use the first and second data sets to determine at least one figure of merit of the imaging instrument, the contrast simulation device, and/or the living tissue.

BRIEF DESCRIPTION OF THE DRAWINGS

Figure 1:
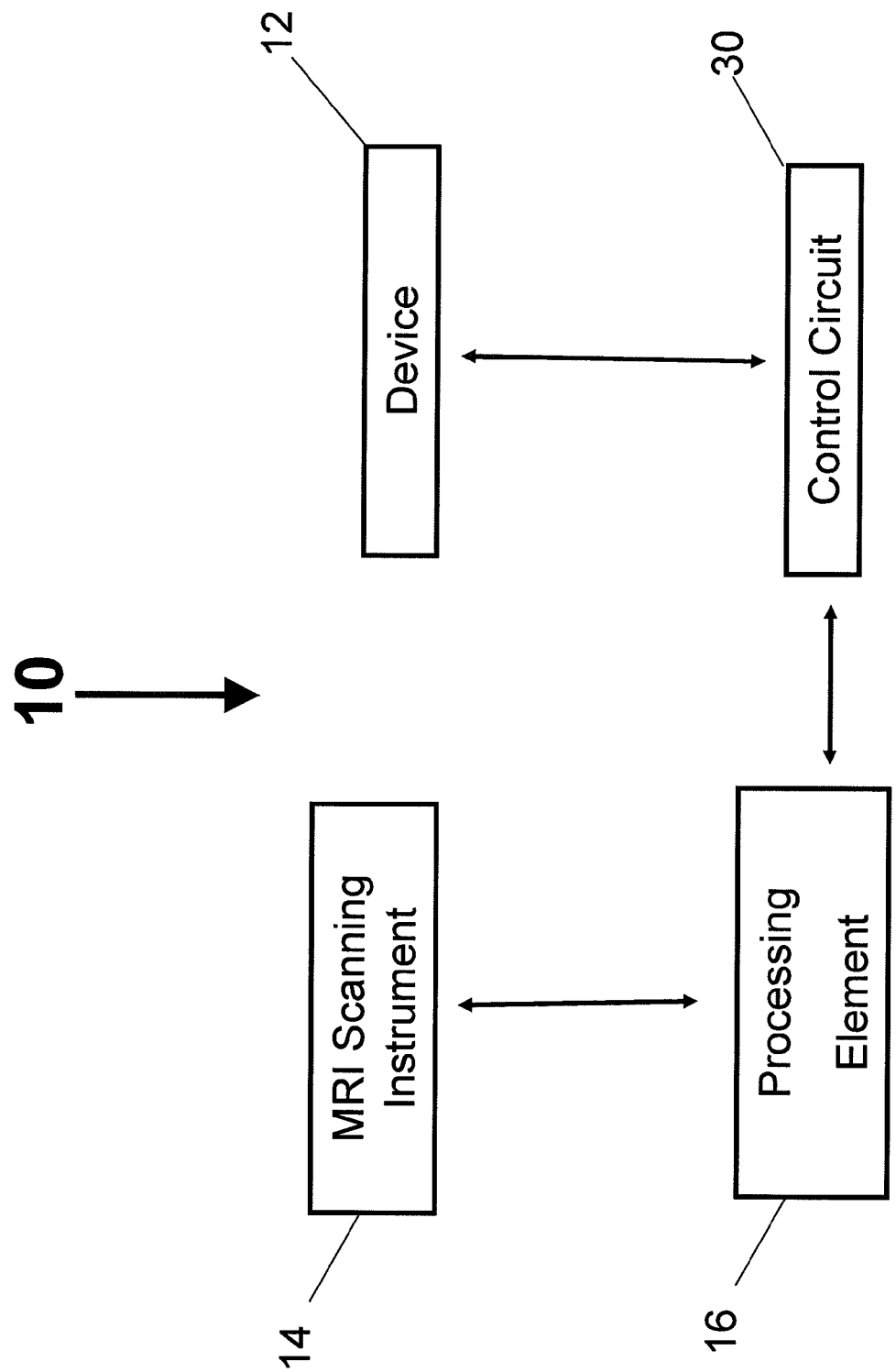

Having thus described the invention in general terms, reference will now be made to the accompanying drawings, which are not necessarily drawn to scale, and wherein:

FIG. 1 depicts a system for calibrating fMRI test results according to a particular embodiment of the invention.

Figure 2:
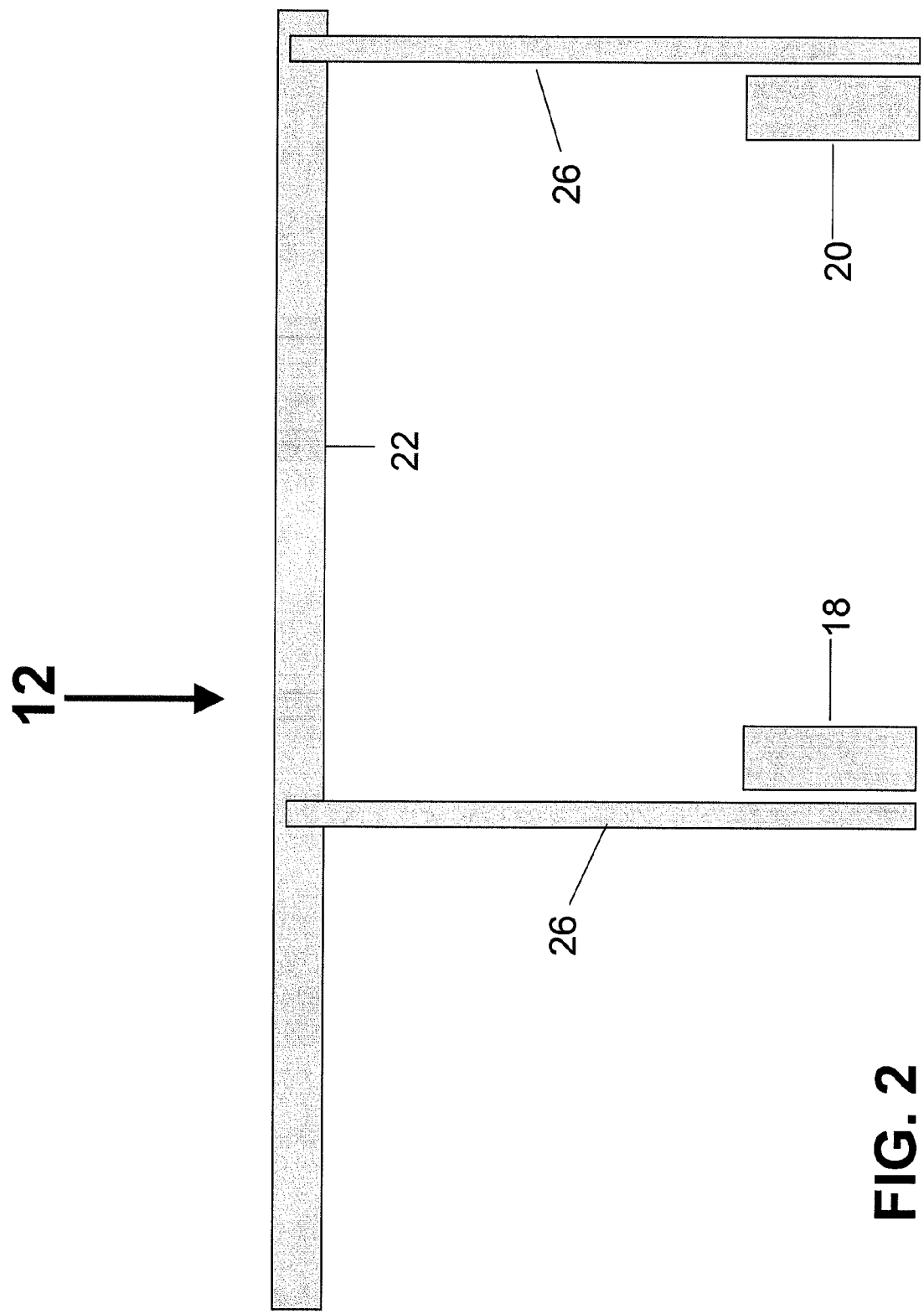

FIG. 2 depicts an elevation view of a device for generating a simulated BOLD/BOSS contrast signal positioned removed from the subject's head according to a particular embodiment of the invention.

DETAILED DESCRIPTION

The present invention will now be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Overview

A method of calibrating an fMRI instrument according to a particular embodiment of the present invention comprises the steps of: (1) providing a BOLD/BOSS contrast signal simulation device that is configured for generating one or more pre-determined BOLD and/or BOSS contrast simulation signals that serve to simulate one or more endogenous BOLD/BOSS contrast signals generated by living tissue (e.g., a human brain); (2) positioning the BOLD/BOSS contrast signal simulation device adjacent a subject (e.g., a human or other living animal); (3) using an imaging instrument, such as a magnetic resonance imaging scanner, to take a first data set from the subject's brain while the BOLD/BOSS contrast signal simulation device is generating the one or more predetermined BOLD/BOSS contrast simulation signals that correspond to one or more endogenous BOLD/BOSS contrast signals generated by the subject's brain; (4) using the imaging instrument to take a second data set from the subject's brain while the BOLD/BOSS contrast signal simulation device is not generating the one or more pre-determined BOLD/BOSS contrast simulation signals; (5) using the first and second data sets to determine statistically reliable differences in the fMRI data (such as by the use of t-tests or deconvolution multiple regression); and (6) using such data regarding the one or more pre-determined BOLD/BOSS contrast simulation signals to determine various figures of merit, such as the sensitivity, specificity, and/or ROC of the imaging instrument for this test application and subject. In this regard, the figures of merit characterize the full measurement system, which includes the imaging instrument, the BOLD/BOSS contrast simulation device, the living subject with their ongoing metabolic activities in the tissue being imaged, and manipulations of the test application procedure that affect the ongoing metabolic activities. Sensitivity, specificity, and/or ROC data may then be used to interpret a subsequent series of task- or event-related fMRI scans of the subject's brain that is taken, for example, while the BOLD/BOSS contrast signal simulation device is not generating the one or more pre-determined BOLD/BOSS contrast simulation signals (e.g., current flowing to the BOLD/BOSS contrast signal simulation device has been turned off). In various embodiments of the invention, the subsequent series of fMRI scans referenced above are taken at nearly the same time as the calibration (the calibration can be interleaved in time with acquisitions of the task-related fMRI images), which may be completed as outlined above. Various exemplary system components and related techniques will now be described in greater detail.

Exemplary System Components

FIG. 1 shows an exemplary system 10 for calibrating fMRI test results. In this embodiment, the system 10 includes: (1) a magnetic resonance imaging scanner 14 for measuring activity in a subject's brain; (2) a BOLD/BOSS contrast signal simulation device 12 that is adapted for generating one or more pre-determined simulated BOLD and/or BOSS contrast signals (e.g., one or more signals that model one or more BOLD/BOSS contrast signals generated by a subject's brain); (3) a control circuit 30 for providing electrical current to the simulation device 12, and (4) a processing element 16 for controlling the simulated BOLD/BOSS contrast signals that drive the control circuit.

In various embodiments of the invention, a BOLD/BOSS contrast signal simulation device 12 and magnetic resonance imaging scanner 14 are in communication with a suitable processing element 16. In particular embodiments, the BOLD/BOSS contrast signal simulation device 12 and magnetic resonance imaging scanner 14 are directly connected to the processing element 16 (e.g., via optical fibers or cable connections) and/or remotely communicate therewith, such as via wireless or network communications. The magnetic resonance imaging scanner 14 may communicate data associated with a particular subject to one or more processing elements 16 in real time, although batch processing may be implemented if desired. Moreover, one or more processing elements 16 is preferably configured for communicating with the BOLD/BOSS contrast signal simulation device 12 and for controlling input signals into the device, as described in greater detail below. For instance, a processing element 16 may be adapted to control the amount of current flowing through the BOLD/BOSS contrast signal simulation device 12 by employing a control circuit 30. According to one embodiment depicted in FIG. 1, the processing element 16 is associated with a control room, while the control circuit 30, magnetic resonance imaging scanner 14, and simulation device 12 are associated with a scanner room.

Examples of various system components are discussed in greater detail below.

Magnetic Resonance Imaging Scanner

Any fMRI-capable magnetic resonance imaging scanner may be used within the context of the present invention. In various embodiments, the magnetic resonance imaging scanner is adapted for acquiring data indicative of a subject's brain activity, for example, by measuring BOLD/BOSS contrast signals associated with at least a portion of a subject's brain. fMRI-capable magnetic resonance imaging scanners are currently manufactured by, for example, General Electric Medical Systems, Siemens Medical Solutions, and Philips Medical Systems.

BOLD/BOSS Contrast Signal Simulation Device

An exemplary BOLD/BOSS contrast signal simulation device 12 according to a particular embodiment of the invention is shown in FIG. 2. Any suitable BOLD/BOSS contrast signal simulation device 12 may be used in accordance with various embodiments of the invention. In the embodiment shown in FIG. 2, the BOLD/BOSS contrast signal simulation device 12 includes a pair of coils 18, 20 that are adapted: (1) to be placed adjacent to a subject (e.g., adjacent to a subject's head); and (2) to generate one or more pre-determined simulated BOLD and/or BOSS contrast signals (e.g., simulated signals that model one or more BOLD/BOSS contrast signals generated by a subject's brain) while the BOLD/BOSS contrast signal simulation device 12 is disposed adjacent to the subject's head.

In a particular embodiment, the first coil 18 and the second coil 20 are adapted to be positioned immediately adjacent opposite locations relative to the center of a human subject's head (e.g., left and right sides). In the embodiment shown in FIG. 2, the BOLD/BOSS contrast signal simulation device 12 includes a pair of coils 18, 20 that are coupled together via a connection mechanism 22 (e.g., a longitudinal connection rod). The device 12 may further include foam pads on the coils 18, 20 to increase comfort of wear for the subject.

FIG. 2 demonstrates that the coils 18, 20 may be coupled via a substantially C-shaped rod assembly. In the embodiment shown in FIG. 2, the rod assembly includes a pair of lateral rods 26 coupled to a longitudinal rod 22 extending between the pair of lateral rods 26. The lateral rods 26 are adapted to support respective coils 18, 20. In particular embodiments, the longitudinal rod 22 is located proximate to respective ends of the lateral rods to allow the subject's head to be positioned therebetween. Additionally, one or both of the lateral rods 26 may be movable along the longitudinal rod 22 and locked into position to accommodate various head sizes. In various embodiments, the BOLD/BOSS contrast signal simulation device 12 includes a control circuit 30 that is in electrical communication with each of the coils 18, 20. This control circuit 30 is preferably adapted to provide a current to the coils 18, 20 to generate one or more simulated BOLD/BOSS contrast signals.

In particular embodiments, both of the coils 18, 20 are aligned with (and/or are orthogonal to) the main magnetic field generated by the fMRI device 14. In various embodiments, current flowing in the coils 18, 20 induces local magnetic field distortion, which simulates BOLD/BOSS susceptibility effects. Namely, current flowing through the coils 18, 20 distorts the main field and/or the orthogonal field causing a dephasing and spectral shift effect similar to that caused by the susceptibility difference between deoxyhemoglobin vs oxyhemoglobin. In particular embodiments, this current is applied to the coils via the control circuit, to implement in a reproducible manner a time series of current input to the coils 18, 20. For example, in various embodiments, the control circuit 30 and/or the processing element 16 controlling the control circuit may be adapted to reproducibly modify the frequency and/or amplitude of the current input to the coils 18, 20.

In particular embodiments, the current within the coils 18, 20 may be modified in any suitable manner. For example, the coils 18, 20 may be adapted to perform either as a Helmholtz pair or a Maxwell pair. In an embodiment in which the coils perform as a Helmholtz pair, the current within the first coil 18 rotates in substantially the same direction as the current within the second coil 20 (e.g., the current within the coils is "co-rotating".) In an embodiment in which the coils perform as a Maxwell pair, the current within the first coil 18 rotates in a direction that is substantially opposite to the direction in which the current within the second coil 20 travels (e.g., the current within the coils 18, 20 is "counter-rotating".)

It should be understood that the BOLD/BOSS contrast signal simulation device 12 shown in FIG. 2 is not meant to be limiting, as the device may be various sizes and configurations in additional embodiments of the present invention. In various embodiments, the BOLD/BOSS contrast signal simulation device is generally capable of being positioned adjacent (e.g., on) a subject's head and for carrying a current through its coils 18, 20 to generate a simulated BOLD/BOSS contrast signal. In particular embodiments, the coils 18, 20 may be independently secured to the subject's head, such as via tape or self-adhering pads. The lateral rods 26 may also be self-adjustable relative to one another along the longitudinal rod 28 such as via elastic that urges the lateral rods toward one another. Moreover, the device 12 may include a pair of control circuits 30 for controlling current input to respective coils 18, 20. Also, in particular embodiments, the device may include more or less than two coils 18, 20.

Processing Element for Processing Acquired fMRI data

The processing element 16 may include any number of conventional hardware and/or software components. For example, the processing element 16 may include memory (e.g., RAM), mass storage (e.g., magnetic hard disk or optical storage disk), an I/O controller, a network interface (e.g., Internet, intranet, or extranet), a bus for transferring data or power between processing element components or between processing elements, and/or a graphical interface. The graphical interface may be adapted to display images generated in response to data captured by the fMRI device 14 onto a monitor or similar viewing device, as well as to facilitate having a user interact with the images. In particular embodiments, the processing element 16 may be adapted to generate and display various types of images, such as a statistical parametric map or other images that facilitate the analysis of the acquired data.

In addition, in various embodiments, the processing element 16 includes a computer processor that is adapted to execute one or more computer applications (e.g., programs), which may, for example, be stored in memory associated with the processing element 16, along with a suitable operating system. For example, the processing element 16 may employ various software programs for processing and displaying data acquired by the fMRI device 14. Exemplary suitable software applications to be run by a processing element 16 for purposes of statistical pattern mapping of functional data and fMRI data visualization include general-purpose fMRI analysis packages, such as AFNI, Brain Voyager, BrainTools, FIASCO, fmristat, iBrain, Lyngby, MEDx, Statistical Parametric Mapping (SPM), and scanSTAT, as well as Special-purpose software packages, such as AIR, ANALYZE, ANIMAL, FreeSurfer, and SureFit.

The processing element 16 preferably includes at least one computer, such as a personal computer or workstation, although the processing element could include any other suitable device. For instance, the processing element 16 may include a portable device, such as a laptop or a personal data assistant. In particular embodiments, the processing element 16 is in communication with the BOLD/BOSS contrast signal simulation device 12 and the fMRI device 14, and may be adapted to communicate with other processing elements residing in a network. For example, a processing element 16 may be employed to control the control circuit 30, while one or more processing elements (e.g., a workstation) may be used to process the data generated by the fMRI device, such as by generating one or more images.

In particular embodiments, the processing element 16 is adapted to collect data and/or display images substantially in real time such that a video representative of the captured data may be shown. Also, in particular embodiments, the processing element 16 is adapted to collect data and/or display still photographs that are representative of the captured data. However, it should also be understood that, in various embodiments, the fMRI device 14 may be adapted to collect data at pre-determined times, rather than sending real-time data to the processing element 16, and to send the data to the processing element 16 for processing and for subsequent display by the graphical interface or for output by an output device, such as a printer. Therefore, although a graphical interface is preferred, it is possible to incorporate the processing element 16 without a display and to instead provide a printout of the image(s), or to utilize any other technique for analyzing the acquired data and/or viewing images of the captured data and acquiring data from the images. In particular embodiments, the processing element 16 is adapted to maintain a permanent record of the captured data and/or images for future use or record keeping (e.g., by saving this data in memory), which allows a user to store and edit previously created images.

Methods of Calibrating an fMRI Device

Exemplary methods for calibrating a measurement system will now be described. However, it should be understood that various other methods (e.g., modified versions of the methods described herein) are included within the scope of various embodiments of the present invention. In one embodiment of the invention, a BOLD/BOSS contrast signal simulation device 12 is first placed adjacent a subject's head so that: (1) a first coil 18 of the BOLD/BOSS contrast signal simulation device 12 is disposed adjacent one location on the subject's head; and (2) a second coil 20 of the BOLD/BOSS contrast signal simulation device 12 is disposed adjacent an opposite location on the subject's head. The BOLD/BOSS contrast signal simulation device 12 is then secured in this position adjacent the subject's head.

Next, the subject is positioned within a monitoring position adjacent a suitable fMRI-capable magnetic resonance imaging scanner (e.g., a position in which at least this portion of the subject's body, e.g., the subject's brain, can be scanned). The subject is then asked to perform a task that would not generate brain activity resulting in an endogenous BOLD/BOSS contrast signal in the region of interest. The BOLD/BOSS contrast signal simulation device 12 (which in one embodiment is preferably aligned or at least substantially aligned with the main magnetic field generated by the fMRI device, and which in another embodiment is preferably aligned or at least substantially aligned orthogonal to the main magnetic field) is then activated to generate one or more pre-determined BOLD/BOSS contrast simulation signals that simulate one or more BOLD/BOSS contrast signals generated by the subject's brain. In various embodiments, these pre-determined BOLD/BOSS contrast simulation signals may be tailored to the particular subject (e.g., they may be based on—and preferably configured to simulate—BOLD/BOSS contrast signals derived from an earlier fMRI scan of the subject's brain). In other embodiments, the simulated BOLD/BOSS contrast signals may be based on standard patient data (e.g., data derived from fMRI scans of one or more other subjects) or derived analytically.

Next, an fMRI-capable magnetic resonance imaging scanner is used to take a first data set from the subject's brain while the BOLD/BOSS contrast signal simulation device is generating the one or more pre-determined BOLD/BOSS contrast simulation signals. A data set is comprised spatially of at least one or more voxels, namely a small measurement volume from which the fMRI signal is measured. A whole-brain fMRI image may be made up of, for example, 64 left-to-right times 64 front-to-back times 32 top-to-bottom voxel locations (128K voxels in the full image), or more. A data set may also comprise one or more measurements made over time of the one or more voxels. The fMRI-capable magnetic resonance imaging scanner is also used to take a second data set from the subject's brain while the BOLD/BOSS contrast signal simulation device is not generating the one or more pre-determined BOLD/BOSS contrast simulation signals. Individual data points from these first and second data sets may be taken in an alternating manner (e.g., by taking a series of images according to a particular imaging time schedule) and: (1) having the BOLD/BOSS contrast signal simulation device generate the one or more pre-determined BOLD/BOSS contrast simulation signals at reproducible points during imaging (e.g., every other whole-brain image, slice, or readout), and (2) having the BOLD/BOSS contrast signal simulation device not generate the one or more pre-determined BOLD/BOSS contrast simulation signals at other reproducible points during imaging (alternate images or slices or readouts).

The first and second data sets include: (1) a small amount of instrument noise; (2) the known simulated BOLD/BOSS contrast signals; and (3) a relatively large "physiological noise" component associated with the patient's heart rate, respiration, motions, etc. Statistical techniques (e.g., t-tests, deconvolution multiple regression, or other appropriate statistical analyses) are applied to the data sets to determine at least one figure of merit, i.e., sensitivity, specificity, and/or receiver operating characteristic (ROC) of the fMRI measurement system, including the scanner, the living subject being imaged, and the effects on the subject as a result of manipulations made during application of the fMRI test. This sensitivity, specificity, and/or ROC information may then be used to interpret a subsequent series of task- or event-related fMRI scans of the subject's brain that is taken, for example, while the BOLD/BOSS contrast signal simulation device is not generating the one or more pre-determined BOLD/BOSS contrast simulation signals. In particular, the sensitivity, specificity, and/or ROC information may be used to determine the accuracy (likelihood of true versus false test outcomes) of the statistically significant differences between data sets relating to task- or event-related activities (e.g., data sets associated with or without a task- or event-related activity).

CONCLUSION

Many modifications and other embodiments of the invention will come to mind to one skilled in the art to which this invention pertains having the benefit of the teachings presented in the foregoing descriptions and the associated drawings. Accordingly, it should be understood that the invention is not to be limited to the specific embodiments disclosed and that modifications and other embodiments are intended to be included within the scope of the appended exemplary concepts. Although specific terms are employed herein, they are used in a generic and descriptive sense only and not for the purposes of limitation.

The invention claimed is:

1. A calibration method comprising the steps of:
providing a contrast signal simulation device that is configured for generating one or more pre-determined contrast simulation signals selected from a group consisting of BOLD and BOSS contrast simulation signals, said one or more pre-determined contrast simulation signals simulating at least one contrast signal generated by living tissue of a subject;
positioning said contrast signal simulation device adjacent to said subject;
using an imaging instrument to take a first data set from said subject's tissue while: (A) said contrast signal simulation device is disposed adjacent to said subject, and (B) said contrast signal simulation device is generating said one or more pre-determined contrast simulation signals;
using said imaging instrument to take a second data set from said subject's tissue while said contrast signal simulation device is not generating said one or more pre-determined contrast simulation signals; and
using said first and second data sets to determine at least one figure of merit of at least one of said imaging instrument, said contrast simulation device, or said living tissue.

2. The method of claim 1, wherein said figure of merit of said imaging instrument takes into account in vivo noise associated with said subject.

3. The method of claim 1, wherein said step of using said first and second data sets to determine at least one figure of merit comprises determining statistically reliable differences between said first and second data sets.

4. The method of claim 1, wherein said subject is a human being or a living animal.

5. The method of claim 1, wherein said imaging instrument is a magnetic resonance imaging device.

6. The method of claim 1, further comprising:
using said imaging instrument to acquire a third data set of said subject's tissue while said subject is being subjected to a particular task or event;
using said imaging instrument to take a fourth data set of said subject's tissue while said subject is not being subjected to said particular task or event;
using said third and fourth data sets to determine statistically significant differences between said third and fourth data sets; and
using said at least one figure of merit to assess an accuracy of said statistically significant differences between said third and fourth data sets.

7. The method of claim 1, wherein said figure of merit is selected from a group consisting of a sensitivity, a specificity, and a receiver operating characteristic.

8. The method of claim 1, wherein each of said first and second data sets is comprised spatially of at least one or more voxels.

9. The method of claim 1, wherein said first and second data sets comprise at least one of instrument noise, physiological noise, or data regarding said one or more pre-determined contrast simulation signals.

10. The method of claim 1, wherein using said first and second data sets to determine said at least one figure of merit of said living tissue comprises at least one of:
determining at least one figure of merit of said living tissue and associated physiological noise; and
determining effects resulting from manipulation of said calibration method that affect said physiological noise.

11. The method of claim 1, wherein said step of using said first and second data sets to determine at least one figure of merit comprises using the first and second data sets to determine at least one figure of merit of said imaging instrument.

12. The method of claim 1, wherein said step of using said first and second data sets to determine at least one figure of merit comprises using the first and second data sets to determine at least one figure of merit of said contrast signal simulation device.

13. The method of claim 1, wherein said step of using said first and second data sets to determine at least one figure of merit comprises using the first and second data sets to determine at least one figure of merit of said living tissue.

14. The method of claim 1, wherein said providing step comprises providing a contrast signal simulation device that is configured to generate one or more pre-determined BOLD and BOSS contrast simulation signals, wherein said step of using said imaging instrument to take a first data set comprises taking a first data set based on said BOLD and BOSS contrast simulation signals, and wherein said step of using said first and second data sets to determine at least one figure of merit comprises determining at least one figure of merit of at least one of said imaging instrument, said contrast signal simulation device, or said living tissue based on said first and second data sets taken by said imaging instrument.

15. A system for calibrating functional magnetic resonance imaging of living tissue comprising:
a contrast signal simulation device that is configured for generating one or more pre-determined contrast simulation signals selected from a group consisting of BOLD and BOSS contrast simulation signals, said one or more pre-determined contrast simulation signals simulating at least one contrast signal generated by living tissue of a subject;

an imaging instrument configured to take a first data set from said subject's tissue while: (A) said contrast signal simulation device is disposed adjacent to said subject, and (B) said contrast signal simulation device is generating said one or more pre-determined contrast simulation signals, wherein said imaging instrument is further configured to take a second data set from said subject's tissue while said contrast signal simulation device is not generating said one or more pre-determined contrast simulation signals; and at least one processing element configured to use said first and second data sets to determine at least one figure of merit of at least one of said imaging instrument, said contrast signal simulation device, or said living tissue.

16. The system of claim 15, wherein said imaging instrument is a magnetic resonance imaging device.

17. The system of claim 15, wherein said processing element is associated with a control room, and wherein said contrast signal simulation device and said imaging instrument are associated with a scanner room.

18. The system of claim 15, wherein said processing element is configured to determine a figure of merit selected from a group consisting of a sensitivity, a specificity, and a receiver operating characteristic.

19. The system of claim 15, wherein said subject is a human being or a living animal.

20. The system of claim 15, wherein said contrast signal simulation device is configured to generate one or more pre-determined BOLD and BOSS contrast simulation signals, wherein said imaging instrument is configured to take a first data set based on said BOLD and BOSS contrast simulation signals, and wherein said processing element is configured to determine at least one figure of merit of at least one of said imaging instrument, said contrast signal simulation device, or said living tissue based on said first and second data sets taken by said imaging instrument.

* * * * *

UNITED STATES PATENT AND TRADEMARK OFFICE
CERTIFICATE OF CORRECTION

PATENT NO. : 7,863,896 B2  Page 1 of 1
APPLICATION NO. : 12/170181
DATED : January 4, 2011
INVENTOR(S) : White It is certified that error appears in the above-identified patent and that said Letters Patent is hereby corrected as shown below:

Column 1
After line 12, and before the subtitle "Background of the Invention", the following should be inserted:
--The invention was made with government support by the U.S. Department of Veteran Affairs. The government has certain rights to the invention.--

Signed and Sealed this
Twentieth Day of December, 2011

David J. Kappos
*Director of the United States Patent and Trademark Office*